(12) United States Patent
Iwashita et al.

(10) Patent No.: US 11,004,684 B2
(45) Date of Patent: May 11, 2021

(54) FORMING METHOD OF HARD MASK

(71) Applicant: Tokyo Electron Limited, Tokyo (JP)

(72) Inventors: Mitsuaki Iwashita, Koshi (JP); Takeshi Nagao, Koshi (JP); Nobutaka Mizutani, Tokyo (JP); Takashi Tanaka, Koshi (JP); Koichi Yatsuda, Tokyo (JP); Kazutoshi Iwai, Koshi (JP); Yuichiro Inatomi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/253,380

(22) Filed: Jan. 22, 2019

(65) Prior Publication Data

US 2019/0157083 A1    May 23, 2019

Related U.S. Application Data

(62) Division of application No. 15/473,810, filed on Mar. 30, 2017, now Pat. No. 10,224,202.

(30) Foreign Application Priority Data

Mar. 31, 2016 (JP) ................. 2016-071472
Oct. 6, 2016 (JP) ................. 2016-198426

(51) Int. Cl.
*H01L 21/033* (2006.01)
*H01L 21/308* (2006.01)
(Continued)

(52) U.S. Cl.
CPC ........ *H01L 21/0332* (2013.01); *C23C 14/042* (2013.01); *C23C 16/042* (2013.01);
(Continued)

(58) Field of Classification Search
CPC ............ H01L 21/0332; H01L 21/3081; H01L 21/32139; H01L 21/31144; C23C 14/042;
(Continued)

(56) References Cited

U.S. PATENT DOCUMENTS 6,406,743 B1 * 6/2002 Lee .................. C23C 18/36
257/E21.174
2002/0074664 A1    6/2002 Nogami et al.
(Continued)

FOREIGN PATENT DOCUMENTS

| JP | 2005-015885 A | 1/2005 |
| JP | 2009-249679 A1 | 10/2009 |
| JP | 2013-134798 A | 7/2013 |

*Primary Examiner* — Laura M Menz
*Assistant Examiner* — Pavel G Ivanov
(74) *Attorney, Agent, or Firm* — Pearne & Gordan LLP

(57) ABSTRACT

A catalyst is imparted selectively to a plateable material portion 32 by performing a catalyst imparting processing on a substrate W having a non-plateable material portion 31 and the plateable material portion 32 formed on a surface thereof. Then, a hard mask layer 35 is formed selectively on the plateable material portion 32 by performing a plating processing on the substrate W. The non-plateable material portion 31 is made of $SiO_2$ as a main component, and the plateable material portion 32 is made of a material including, as a main component, a material containing at least one of a $OCH_x$ group and a $NH_x$ group, a metal material containing Si as a main component, a material containing carbon as a main component or a catalyst metal material.

4 Claims, 8 Drawing Sheets

(51) Int. Cl.
- *C23C 18/16* (2006.01)
- *C23C 16/04* (2006.01)
- *C23C 14/04* (2006.01)
- *C23C 18/18* (2006.01)
- *C23C 18/32* (2006.01)
- *C23C 18/50* (2006.01)
- *H01L 21/311* (2006.01)
- *H01L 21/3213* (2006.01)

(52) U.S. Cl.
CPC ........ *C23C 18/163* (2013.01); *C23C 18/1603* (2013.01); *C23C 18/1605* (2013.01); *C23C 18/1619* (2013.01); *C23C 18/1632* (2013.01); *C23C 18/1639* (2013.01); *C23C 18/1642* (2013.01); *C23C 18/1675* (2013.01); *C23C 18/1893* (2013.01); *C23C 18/32* (2013.01); *C23C 18/50* (2013.01); *H01L 21/3081* (2013.01); *H01L 21/31144* (2013.01); *H01L 21/32139* (2013.01)

(58) Field of Classification Search
CPC ... C23C 16/042; C23C 18/1605; C23C 18/50; C23C 18/32; C23C 18/1893; C23C 18/1642; C23C 18/1639; C23C 18/1632; C23C 18/1619; C23C 18/1603; C23C 18/1675; C23C 18/163
See application file for complete search history.

(56) References Cited

U.S. PATENT DOCUMENTS

| | | |
|---|---|---|
| 2005/0009213 A1 | 1/2005 | Wang et al. |
| 2005/0282378 A1 | 12/2005 | Fukunaga et al. |
| 2009/0152602 A1 | 6/2009 | Akiyama |
| 2009/0253258 A1 | 10/2009 | Hara et al. |
| 2014/0239443 A1* | 8/2014 | Gallagher ............... C23C 18/50 257/531 |
| 2015/0221519 A1* | 8/2015 | Marks ................. H01L 21/0337 430/5 |

\* cited by examiner

FORMING METHOD OF HARD MASK

CROSS-REFERENCE TO RELATED APPLICATION

This is a divisional application of U.S. patent application Ser. No. 15/473,810, filed on Mar. 30, 2017, which claims the benefit of Japanese Patent Application Nos. 2016-071472 and 2016-198426 filed on Mar. 31, 2016 and Oct. 6, 2016, respectively, the entire disclosures of which are incorporated herein by reference.

TECHNICAL FIELD

The embodiments described herein pertain generally to a forming method of a hard mask, a forming apparatus of the hard mask and a recording medium.

BACKGROUND

Recently, with a progress of miniaturization and three-dimensionalization of semiconductor devices, it is required to improve processing accuracy of etching when processing the semiconductor devices. As one way to improve the processing accuracy of the etching, it is required to improve accuracy of a hard mask HM for dry etching which is formed on a substrate.

Conventionally, a hard mask is formed on a substrate through the following manner, for example. First, a film of a hard mask material such as SiN (silicon nitride) or TiN (titanium nitride) is formed on an entire surface of the substrate, and a resist layer having a preset pattern is formed on the hard mask material. Thereafter, the hard mask material which is not covered with the resist layer is removed by dry etching, so that a hard mask having the preset pattern is formed on the substrate. Subsequently, a part of the substrate which is not covered with the hard mask is removed by dry etching. Then, the hard mask is removed by a wet cleaning method or the like.

Patent Document 1: Japanese Patent Laid-open Publication No. 2009-249679

In the prior art, however, there are many various limitations on the hard mask material which covers the substrate. Such limitations include: (1) adhesivity between the hard mask and the substrate needs to be high (2) adhesivity between the hard mask and the resist layer needs to be high, (3) the hard mask material needs to be difficult to damage by heat treatment when forming the pattern on the resist layer, (4) the resist layer needs to be difficult to remove when the hard mask is etched, (5) the hard mask needs to be difficult to remove when the substrate is dry-etched, and (6) the hard mask needs to be easy to remove after the substrate is dry-etched. For these limitations, only a limited material such as the aforementioned SiN (silicon nitride) or TiN (titanium nitride) has been used as the hard mask material.

SUMMARY

In view of the foregoing, exemplary embodiments provide a forming method of a hard mask, a forming apparatus of the hard mask and a recording medium which enable reduction of limitations upon a material of the hard mask.

In one exemplary embodiment, a forming method of a hard mask includes preparing a substrate having a non-plateable material portion and a plateable material portion formed on a surface thereof; imparting a catalyst selectively to the plateable material portion by performing a catalyst imparting processing on the substrate; and forming a hard mask layer selectively on the plateable material portion by performing a plating processing on the substrate. Here, the non-plateable material portion is made of $SiO_2$ as a main component, and the plateable material portion is made of a material including, as a main component, a material containing at least one of a $OCH_x$ group and a $NH_x$ group, a metal material containing Si as a main component, a catalyst metal material, or a material containing carbon as a main component.

In another exemplary embodiment, a forming apparatus of a hard mask includes a substrate holding unit configured to hold a substrate having a non-plateable material portion and a plateable material portion formed on a surface thereof; a catalyst imparting unit configured to impart a catalyst selectively to the plateable material portion by performing a catalyst imparting processing on the substrate; and a plating liquid supply unit configured to form a hard mask layer selectively on the plateable material portion by supplying a plating liquid onto the substrate. Here, the non-plateable material portion is made of $SiO_2$ as a main component, and the plateable material portion is made of a material including, as a main component, a material containing at least one of a $OCH_x$ group and a $NH_x$ group, a metal material containing Si as a main component, a catalyst metal material, or a material containing carbon as a main component.

According to the exemplary embodiment, it is possible to reduce limitations upon the material of the hard mask.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
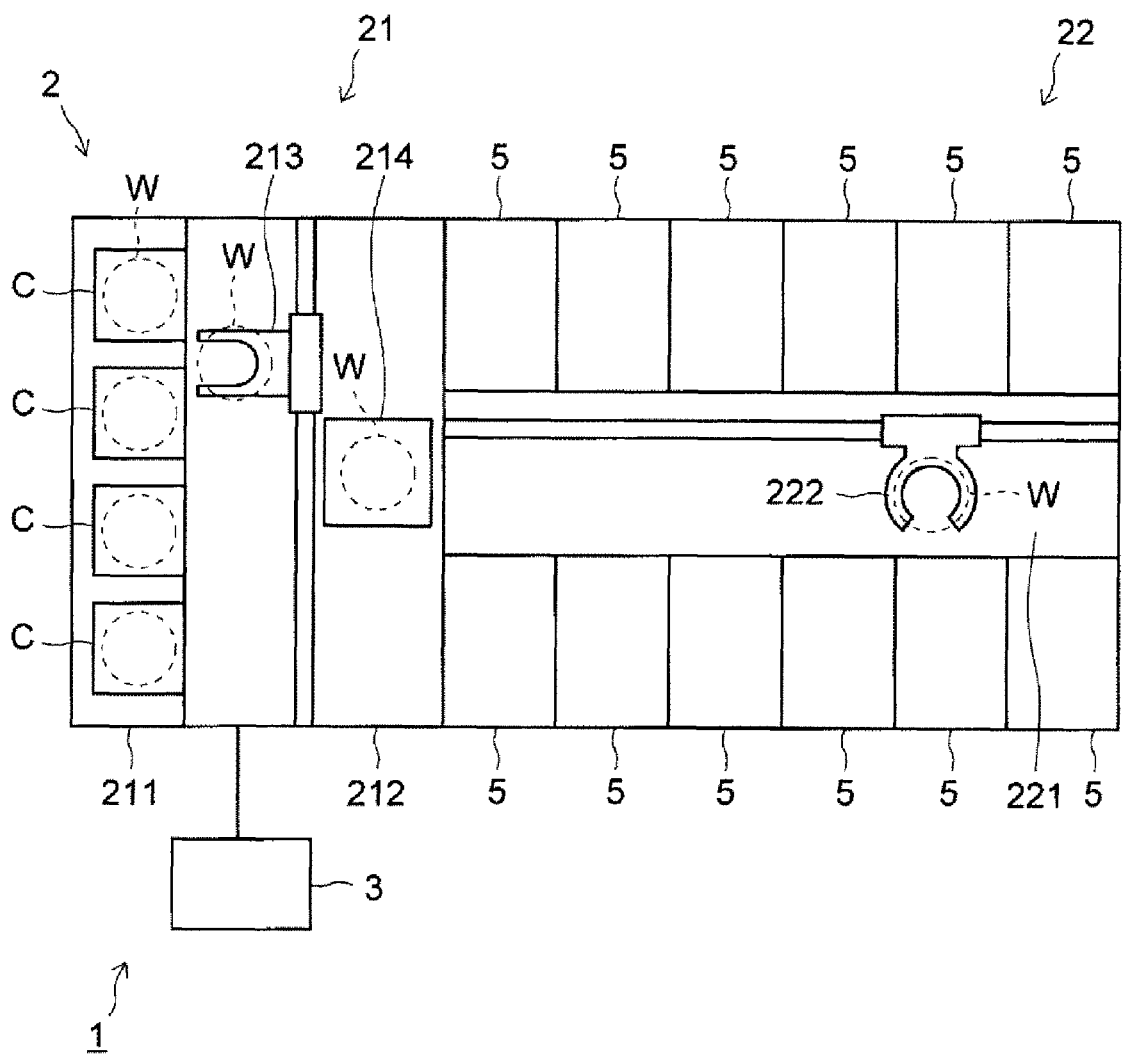
FIG. 1 is a schematic plan view illustrating a configuration of a plating apparatus and a plating unit provided in the plating apparatus.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, an exemplary embodiment will be explained in detail with reference to the accompanying drawings. Here, however, it should be noted that the present disclosure is not limited to the following exemplary embodiment.

<Configuration of Plating Apparatus>

Referring to FIG. 1, a configuration of a plating apparatus according to an exemplary embodiment will be explained. FIG. 1 is a schematic diagram illustrating the configuration of the plating apparatus according to the exemplary embodiment.

As depicted in FIG. 1, the plating apparatus 1 according to the exemplary embodiment includes a plating unit 2 and a controller 3 configured to control an operation of the plating unit 2.

The plating unit 2 is configured to perform various processings on a substrate. The various processings performed by the plating unit 2 will be described later.

The controller 3 is implemented by, for example, a computer, and includes an operation controller and a storage unit. The operation controller is implemented by, for example, a CPU (Central Processing Unit) and is configured to control the operation of the plating unit 2 by reading and executing a program stored in the storage unit. The storage unit is implemented by a storage device such as, but not limited to, a RAM (Random Access Memory), a ROM (Read Only Memory) or a hard disk, and stores thereon a program for controlling various processings performed in the plating unit 2. Further, the program may be recorded in a computer-readable recording medium, or may be installed from the recording medium to the storage unit. The computer-readable recording medium may be, for example, a hard disc (HD), a flexible disc (FD), a compact disc (CD), a magnet optical disc (MO), or a memory card. The recording medium has stored thereon a program that, when executed by a computer for controlling an operation of the plating apparatus 1, causes the plating apparatus 1 to perform a plating method to be described later under the control of the computer.

<Configuration of Plating Unit>

Referring to FIG. 1, a configuration of the plating unit 2 will be discussed. FIG. 1 is a schematic plan view illustrating the configuration of the plating unit 2.

The plating unit 2 includes a carry-in/out station 21; and a processing station 22 provided adjacent to the carry-in/out station 21.

The carry-in/out station 21 includes a placing section 211; and a transfer section 212 provided adjacent to the placing section 211.

In the placing section 211, multiple transfer containers (hereinafter, referred to as "carriers C") each of which accommodates a plurality of substrates W horizontally is placed.

The transfer section 212 is provided with a transfer device 213 and a delivery unit 214. The transfer device 213 is provided with a holding mechanism configured to hold a substrate W. The transfer device 213 is configured to be movable horizontally and vertically and pivotable around a vertical axis.

The processing station 22 includes plating devices 5. In the present exemplary embodiment, the number of the plating devices 5 provided in the processing station 22 may be two or more, but it is also possible to provide only one plating device 5. The plating devices 5 are arranged at both side of a transfer path 221 which is extended in a preset direction.

The transfer path 221 is provided with a transfer device 222. The transfer device 222 includes a holding mechanism configured to hold a substrate W, and is configured to be movable horizontally and vertically and pivotable around a vertical axis.

In the plating unit 2, the transfer device 213 of the carry-in/out station 21 is configured to transfer the substrate W between the carrier C and the delivery unit 214. To elaborate, the transfer device 213 takes out the substrate W from the carrier C placed in the placing section 211, and then, places the substrate W in the delivery unit 214. Further, the transfer device 213 takes out the substrate W which is placed in the delivery unit 214 by the transfer device 222 of the processing station 22, and then, accommodates the substrate W in the carrier C of the placing section 211.

In the plating unit 2, the transfer device 222 of the processing station 22 is configured to transfer the substrate W between the delivery unit 214 and the plating device 5 and between the plating device 5 and the delivery unit 214. To elaborate, the transfer device 222 takes out the substrate W placed in the delivery unit 214 and carries the substrate W into the plating device 5. Further, the transfer device 222 takes out the substrate W from the plating device 5 and places the substrate W in the delivery unit 214.

<Configuration of Plating Device>

Figure 2:
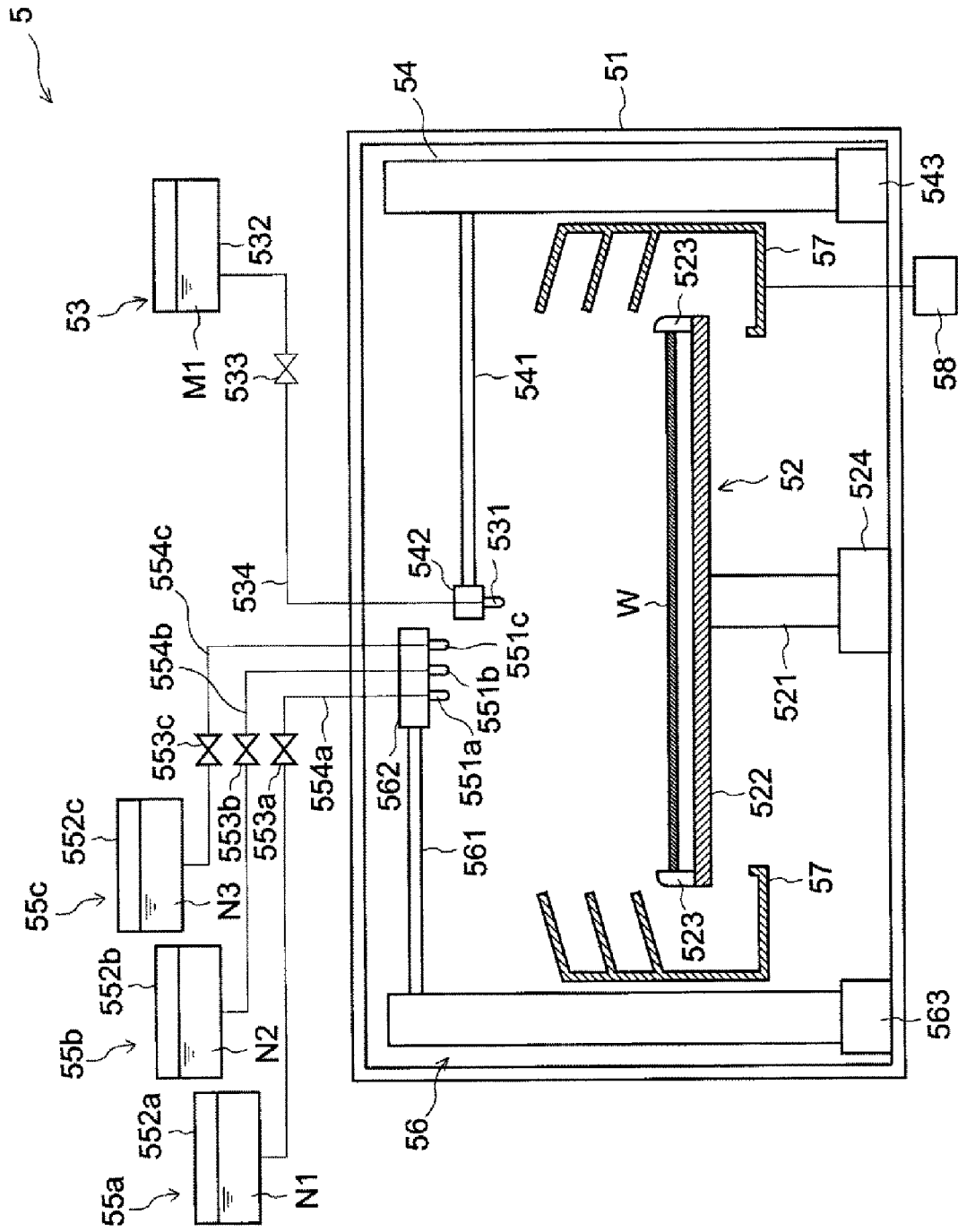
FIG. 2 is a schematic cross sectional view illustrating a configuration of a plating device (a forming apparatus of a hard mask) provided in the plating unit shown in FIG. 1.

Referring to FIG. 2, a configuration of the plating device 5 (the forming apparatus of the hard mask) will be explained. FIG. 2 is a schematic cross sectional view illustrating the configuration of the plating device 5.

The plating device 5 is configured to perform a plating processing on a substrate W having a non-plateable material portion 31 and a plateable material portion 32 on a surface thereof, and configured to form a hard mask layer 35 selectively on the plateable material portion (refer to FIG. 3 to FIG. 6C to be described later). A substrate processing performed by the plating device 5 includes a catalyst imparting processing and an electroless plating processing at least. However, the substrate processing may further include processings other than the catalyst imparting processing and the electroless plating processing.

The plating device 5 is configured to perform a substrate processing including the aforementioned electroless plating processing. The plating device 5 includes a chamber 51; a substrate holding unit 52 provided within the chamber 51 and configured to hold the substrate W; and a plating liquid supply unit 53 configured to supply a plating liquid M1 to the substrate W held by the substrate holding unit 52.

The substrate holding unit 52 includes a rotation shaft 521 extended in a vertical direction within the chamber 51; a turntable 522 provided at an upper end portion of the rotation shaft 521; a chuck 523 provided on an outer peripheral portion of a top surface of the turntable 522 and configured to support an edge portion of the substrate W; and a driving unit 524 configured to rotate the rotation shaft 521.

The substrate W is supported by the chuck 523 to be horizontally held on the turntable 522 while being slightly spaced apart from the top surface of the turntable 522. In the present exemplary embodiment, a mechanism of holding the substrate W by the substrate holding unit 52 is of a so-called mechanical chuck type in which the edge portion of the substrate W is held by the chuck 523 which is configured to be movable. However, a so-called vacuum chuck type of vacuum attracting a rear surface of the substrate W may be used instead.

A base end portion of the rotation shaft 521 is rotatably supported by the driving unit 524, and a leading end portion of the rotation shaft 521 sustains the turntable 522 horizontally. If the rotation shaft 521 is rotated, the turntable 522 placed on the upper end portion of the rotation shaft 521 is rotated, and, as a result, the substrate W which is held on the turntable 522 by the chuck 523 is also rotated.

The plating liquid supply unit 53 is equipped with a nozzle 531 configured to discharge the plating liquid M1 onto the substrate W held by the substrate holding unit 52; and a plating liquid supply source 532 configured to supply the plating liquid M1 to the nozzle 531. The plating liquid M1 is stored in a tank of the plating liquid supply source 532, and the plating liquid M1 is supplied into the nozzle 531 from the plating liquid supply source 532 through a supply passageway 534 which is equipped with a flow rate controller such as a valve 533.

The plating liquid M1 is an autocatalytic (reduction) plating liquid for electroless plating. The plating liquid M1 contains a metal ion such as a cobalt (Co) ion, a nickel (Ni) ion, a tungsten (W) ion; and a reducing agent such as hypophosphorous acid or dimethylamineborane. Further, in the autocatalytic (reduction) electroless plating, the metal ion in the plating liquid M1 is reduced by the electrons emitted in an oxidation reaction of the reducing agent in the plating liquid M1 and is precipitated as a metal, so that a metal film (plating film) is formed. The plating liquid M1 may further contain an additive or the like. The metal film (plating film) formed by the plating processing with the plating liquid M1 may be, by way of non-limiting example, CoB, CoP, CoWP, CoWB, CoWBP, NiWB, NiB, NiWP, NiWBP, or the like. P in the metal film (plating film) is originated from the reducing agent (e.g., hypophosphorous acid) containing P, and B in the plating film is originated from the reducing agent (e.g., dimethylamineborane) containing B.

The nozzle 531 is connected to a nozzle moving mechanism 54. The nozzle moving mechanism 54 is configured to drive the nozzle 531. The nozzle moving mechanism 54 includes an arm 541, a moving body 542 which is configured to be movable along the arm 541 and has a driving mechanism embedded therein; and a rotating/elevating mechanism 543 configured to rotate and move the arm 541 up and down.

The nozzle 531 is provided at the moving body 542. The nozzle moving mechanism 54 is capable of moving the nozzle 531 between a position above a center of the substrate W held by the substrate holding unit 52 and a position above a periphery of the substrate W, and is also capable of moving the nozzle 531 up to a stand-by position outside a cup 57 to be described later when viewed from the top.

Within the chamber 51, there are arranged a catalyst solution supply unit (catalyst imparting unit) 55$a$, a cleaning liquid supply unit 55$b$ and a rinse liquid supply unit 55$c$ configured to supply a catalyst solution N1, a cleaning liquid N2 and a rinse liquid N3 onto the substrate W held by the substrate holding unit 52, respectively.

The catalyst solution supply unit (catalyst imparting unit) 55$a$ includes a nozzle 551$a$ configured to discharge the catalyst solution N1 onto the substrate W held by the substrate holding unit 52; and a catalyst solution supply source 552$a$ configured to supply the catalyst solution N1 to the nozzle 551$a$. The catalyst solution N1 is stored in a tank of the catalyst solution supply source 552$a$, and the catalyst solution N1 is supplied to the nozzle 551$a$ from the catalyst solution supply source 552$a$ through a supply passageway 554$a$ which is provided with a flow rate controller such as a valve 553$a$.

The cleaning liquid supply unit 55$b$ includes a nozzle 551$b$ configured to discharge the cleaning liquid N2 onto the substrate W held by the substrate holding unit 52; and a cleaning liquid supply source 552$b$ configured to supply the cleaning liquid N2 to the nozzle 551$b$. The cleaning liquid N2 is stored in a tank of the cleaning liquid supply source 552$b$, and the cleaning liquid N2 is supplied to the nozzle 551$b$ from the cleaning liquid supply source 552$b$ through a supply passageway 554$b$ which is provided with a flow rate controller such as a valve 553$b$.

The rinse liquid supply unit 55$c$ includes a nozzle 551$c$ configured to discharge the rinse liquid N3 onto the substrate W held by the substrate holding unit 52; and a rinse liquid supply source 552$c$ configured to supply the rinse liquid N3 to the nozzle 551$c$. The rinse liquid N3 is stored in a tank of the rinse liquid supply source 552$c$, and the rinse liquid N3 is supplied to the nozzle 551$c$ from the rinse liquid supply source 552$c$ through a supply passageway 554$c$ which is provided with a flow rate controller such as a valve 553$c$.

The catalyst solution N1 contains a metal ion having catalytic activity to the oxidation reaction of the reducing agent in the plating liquid M1. In the electroless plating processing, in order for precipitation of the metal ion in the plating liquid M1 to be started, an initial film surface (that is, a plating target surface of the substrate) needs to have sufficient catalytic activity to the oxidation reaction of the reducing agent in the plating liquid M1. As an example, such a catalyst may include, by way of example, but not limitation, an iron group element (Fe, Co, Ni), a platinum metal element (Ru, Rh, Pd, Os, Ir, Pt), Cu, Ag or Au. The metal film having the catalytic activity is formed through a replacement reaction. In the replacement reaction, a component forming the plating target surface of the substrate serves as the reducing agent, and the metal ion (e.g., Pd ion) in the catalyst solution N1 is reduced and precipitated on the plating target surface of the substrate. Further, the catalyst solution N1 may contain a metal catalyst in the form of nanoparticles. To be more specific, the catalyst solution N1 may contain a metal catalyst in the form of nanoparticles, a dispersant and an aqueous solution. The metal catalyst in the form of nanoparticles may be, by way of non-limiting example, nanoparticle-shaped palladium (Pd).

As an example of the cleaning liquid N2, an organic acid such as a formic acid, malic acid, a succinic acid, a citric acid or a malonic acid, or hydrofluoric acid (DHF) (aqueous solution of hydrogen fluoride) diluted to the extent that it does not corrode the plating target surface of the substrate may be used.

As an example of the rinse liquid N3, pure water may be used.

The plating device 5 includes a nozzle moving mechanism 56 configured to move the nozzles 551a to 551c. The nozzle moving mechanism 56 is equipped with an arm 561; a moving body 562 which is configured to be movable along the arm 561 and has a moving mechanism embedded therein; and a rotating/elevating mechanism 563 configured to rotate and move the arm 561 up and down. The nozzles 551a to 551c are provided at the moving body 562. The nozzle moving mechanism 56 is capable of moving the nozzles 551a to 551c between a position above the central portion of the substrate W held by the substrate holding unit 52 and a position above the peripheral portion of the substrate W, and also capable of moving the nozzles 551a to 551c up to a stand-by position outside the cup 57 to be described later when viewed from the top. In the present exemplary embodiment, though the nozzles 551a to 551c are held by the common arm, they may be configured to be held by different arms and moved independently.

The cup 57 is disposed around the substrate holding unit 52. The cup 57 is configured to receive various kinds of processing liquids (e.g., the plating liquid, the cleaning liquid, the rinse liquid, etc.) scattered from the substrate W and drain the received processing liquids to the outside of the chamber 51. The cup 51 is equipped with an elevating mechanism 58 configured to move the cup 57 up and down.

<Structure of Substrate>

Now, a structure of a substrate on which a hard mask layer is to be formed according to a forming method of a hard mask according to the present exemplary embodiment will be explained.

Figure 3:
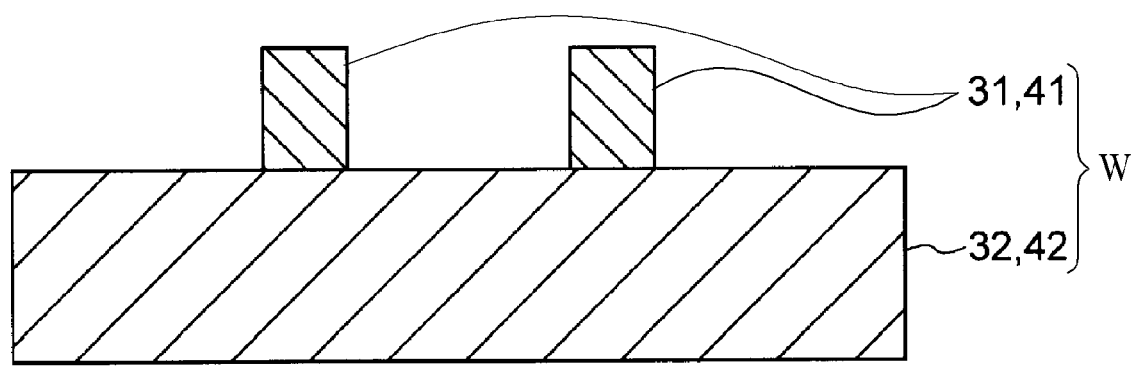
FIG. 3 is a schematic cross sectional view illustrating a structure of a substrate on which a hard mask layer is formed by a forming method of a hard mask according to an exemplary embodiment.

As depicted in FIG. 3, a substrate W on which a hard mask layer is to be formed includes a non-plateable material portion 31 and a plateable material portion 32 respectively formed on a surface thereof. There is no specific limitation in the structure of the non-plateable material portion 31 and the plateable material portion 32 as long as they are exposed at the surface side of the substrate W. In the present exemplary embodiment, the substrate W includes a base member 42 made of the plateable material portion 32 and a core member 41 which is protruded on the base member 42 and is made of the non-plateable material portion 31 having a pattern shape.

The non-plateable material portion 31 is a region where a plating metal is not precipitated and a hard mask layer 35 is not formed when a plating processing according to the present exemplary embodiment is performed. In the present exemplary embodiment, the non-plateable material portion 31 is made of a material containing $SiO_2$ as a main component.

The plateable material portion 32 is a region where the plating metal is selectively precipitated and the hard mask layer 35 is resultantly formed when the plating processing according to the present exemplary embodiment is performed. In the present exemplary embodiment, the plateable material portion 32 is made of any one of (1) a material containing at least one of a $OCH_x$ group and a $NH_x$ group, (2) a metal material containing a Si-based material as a main component, (3) a material containing a catalyst metal material as a main component, and (4) a material containing carbon as a main component.

(1) In case that the material of the plateable material portion 32 includes, as the main component, the material containing at least one of the $OCH_x$ group and the $NH_x$ group, this material may be a material containing a Si—$OCH_x$ group or a Si—$NH_x$ group such as SiOCH or SiN.

(2) In case that the material of the plateable material portion 32 is the metal material containing the Si-based material as the main component, the material of the plateable material portion 32 may be, by way of non-limiting example, B- or P-doped poly-Si, poly-Si or Si.

(3) In case that the plateable material portion 32 includes, as the main component, the material containing the catalyst metal material as the main component, the material of the plateable material portion 32 may be, by way of example, but not limitation, Cu or Pt.

(4) In case that the plateable material portion 32 includes, as the main component, the material containing the carbon as the main component, the material of the plateable material portion 32 may be, for example, amorphous carbon.

Figure 4A:
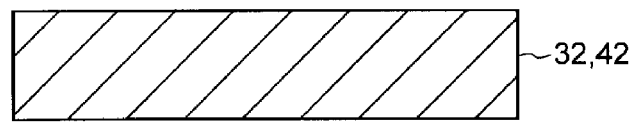
FIG. 4A to FIG. 4E are schematic cross sectional views illustrating a manufacturing method of the substrate on which the hard mask layer is formed by the forming method of the hard mask according to the exemplary embodiment.

Now, a method of fabricating the substrate W shown in FIG. 3 will be explained. To produce the substrate W shown in FIG. 3, the base member 42 made of the plateable material portion 32 is prepared, as illustrated in FIG. 4A. As state above, the base member 42 is made of the material including, as the main component, the material containing at least one of the $OCH_x$ group and the $NH_x$ group, the metal material containing the Si-based material as the main component, the catalyst metal material, or the material containing the carbon as the main component.

Figure 4B:
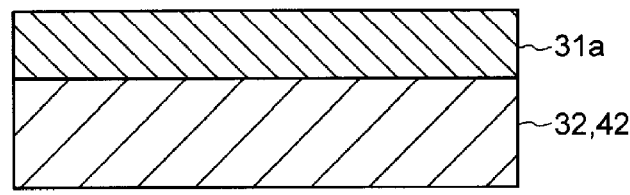

Thereafter, as depicted in FIG. 4B, a film of a material 31a, which forms the non-plateable material portion 31, is formed on the entire surface of the base member 42 made of the plateable material portion 32 by a CVD method, a PVD method or the like. The material 31a is composed of the material containing $SiO_2$ as the main component, as mentioned above.

Figure 4C:
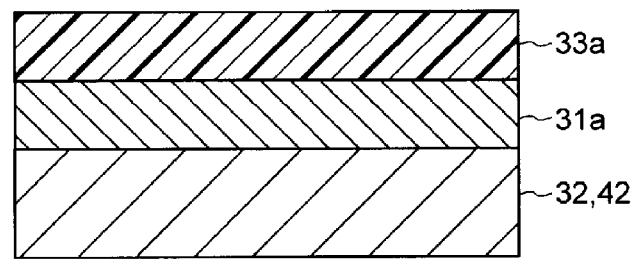
Figure 4D:
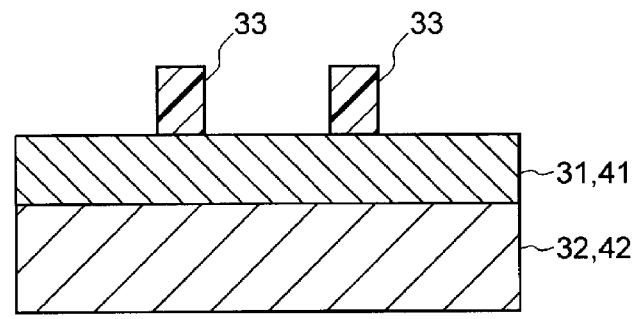

Subsequently, as illustrated in FIG. 4C, a photosensitive resist 33a is coated on the entire surface of the material 31a forming the non-plateable material portion 31 and is dried. Then, by exposing the photosensitive resist 33a through a photo mask and developing it, a resist film 33 having a required pattern is formed, as shown in FIG. 4D.

Figure 4E:
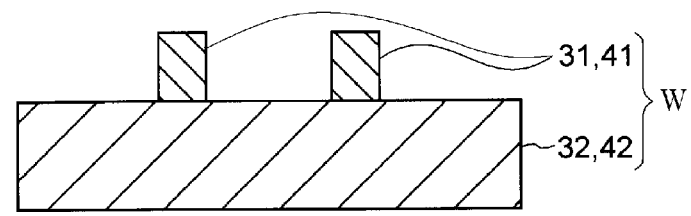

Afterwards, as depicted in FIG. 4E, the material 31a is dry-etched by using the resist film 33 as a mask. As a result, the core member 41 made of the non-plateable material portion 31 is patterned to have substantially the same shape as the pattern shape of the resist film 33. Then, by removing the resist film 33, there is obtained the substrate W having the non-plateable material portion 31 and the plateable material portion 32 formed on the surface thereof.

<Forming Method of Hard Mask>

Now, a forming method of a hard mask performed by the plating apparatus 1 will be discussed. The forming method of the hard mask performed by plating apparatus 1 includes a plating processing upon the aforementioned substrate W. The plating processing is performed by the plating device (the forming apparatus of the hard mask) 5. An operation of the plating device 5 is controlled by the controller 3.

Figure 5A:
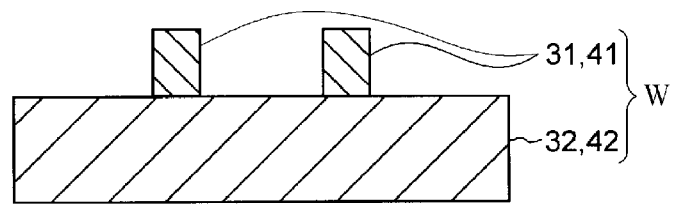
FIG. 5A and FIG. 5B are schematic cross sectional views showing the forming method of the hard mask according to the exemplary embodiment.
Figure 5B:
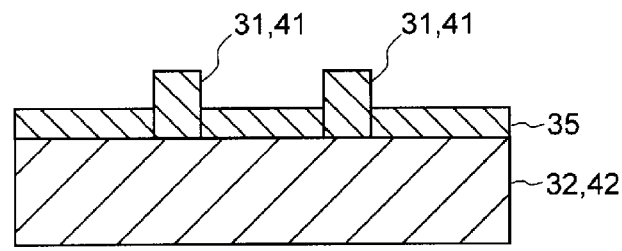

First, the substrate W having the non-plateable material portion 31 and the plateable material portion 32 formed on the surface thereof is prepared by performing the above-described method of FIG. 4A to FIG. 4E (see FIG. 5A).

The prepared substrate W is then carried into the plating device 5 and is held by the substrate holding unit 52 (see FIG. 2). In the meanwhile, the controller 3 controls the elevating mechanism 58 to move the cup 57 down to a preset position. Then, the controller 3 controls the transfer device 222 to place the substrate W on the substrate holding unit 52. The substrate W is horizontally placed on the turntable 522 while its periphery portion is held by the chuck 523.

Then, the substrate W held by the substrate holding unit 52 is cleaned. At this time, while controlling the driving unit 524 to rotate the substrate W held by the substrate holding unit 52 at a preset speed, the controller 3 controls the cleaning liquid supply unit 55b to locate the nozzle 551b at a position above the substrate W and to supply a cleaning liquid N2 onto the substrate W from the nozzle 551b. The cleaning liquid N2 supplied onto the substrate W is diffused on the surface of the substrate W by a centrifugal force which is caused by the rotation of the substrate W. As a result, a deposit or the like adhering to the substrate W is removed from the substrate W. The cleaning liquid N2 scattered from the substrate W is drained through the cup 57.

Subsequently, the substrate W after being cleaned is rinsed. At this time, while controlling the driving unit 524 to rotate the substrate W held by the substrate holding unit 52 at a preset speed, the controller 3 controls the rinse liquid supply unit 55c to locate the nozzle 551c at a position above the substrate W, and to supply a rinse liquid N3 onto the substrate W from the nozzle 551c. The rinse liquid N3 supplied onto the substrate W is diffused on the surface of the substrate W by a centrifugal force which is caused by the rotation of the substrate W. As a result, the cleaning liquid N2 remaining on the substrate W is washed away. The rinse liquid N3 scattered from the substrate W is drained through the cup 57.

Thereafter, a catalyst imparting processing is performed on the substrate W after being rinsed. At this time, while controlling the driving unit 524 to rotate the substrate W held by the substrate holding unit 52 at a preset speed, the controller 3 controls the catalyst solution supply unit 55a to locate the nozzle 551a at a position above the substrate W and to supply a catalyst solution N1 onto the substrate W from the nozzle 551a. The catalyst solution N1 supplied onto the substrate W is diffused on the surface of the substrate W by a centrifugal force which is caused by the rotation of the substrate W. The catalyst solution N1 scattered from the substrate W is drained through the cup 57.

Accordingly, a catalyst is selectively imparted to the plateable material portion 32 of the substrate W, so that a metal film having catalytic activity is formed on the plateable material portion 32. Meanwhile, the catalyst is not substantially imparted to the non-plateable material portion 31 of the substrate W, which is mainly made of $SiO_2$, so that the metal film having the catalytic activity is not formed at this non-plateable material portion 31. By way of example, the metal having such catalytic activity may include, but not limitation, an iron group element (Fe, Co, Ni), a platinum metal element (Ru, Rh, Pd, Os, Ir, Pt), Cu, Ag or Au. Each of these metals have high adsorption property to the material (e.g., the material containing at least one of the $OCH_x$ group and the $NH_x$ group) forming the plateable material portion 32, whereas each of these metals is difficult to adsorb with respect to the $SiO_2$ which is a material forming the non-plateable material portion 31. For this reason, by using each of the aforementioned metals, a plating metal can be selectively precipitated on the plateable material portion 32. Further, the catalyst solution N1 may contain an adsorption promoting agent which promotes adsorption of the metal having the catalytic activity.

Subsequently, the substrate W, in which the catalyst is selectively imparted on the plateable material portion 32, is rinsed. To elaborate, while controlling the driving unit 524 to rotate the substrate W held by the substrate holding unit 52 at a preset speed, the controller 3 controls the rinse liquid supply unit 55c to locate the nozzle 551c at the position above the substrate W and to supply the rinse liquid N3 onto the substrate W from the nozzle 551c. The rinse liquid N3 supplied onto the substrate W is diffused on the surface of the substrate W by the centrifugal force which is caused by the rotation of the substrate W. As a result, the catalyst solution N1 remaining on the substrate W is washed away. The rinse liquid N3 scattered from the substrate W is drained through the cup 57.

Then, the plating processing is performed on the substrate W, and the plating is selectively performed on the plateable material portion 32. Resultantly, a hard mask layer 35 is formed on the plateable material portion 32 (see FIG. 5B). The hard mask layer 35 is formed at a portion of the plateable material portion 32 where the non-plateable material portion 31 is not provided. At this time, while controlling the driving unit 524 to rotate the substrate W held by the substrate holding unit 52 at a preset speed or while maintaining the substrate W held by the substrate holding unit 52 stopped, the controller 3 controls the plating liquid supply unit 53 to locate the nozzle 531 at a position above the substrate W to supply the plating liquid M1 onto the substrate W from the nozzle 531. Accordingly, the plating metal is selectively precipitated on the plateable material portion 32 (specifically, on the metal film having the catalytic activity formed on the surface of the plateable material portion 32) of the substrate W, so that the hard mask layer 35 is obtained. Meanwhile, since the metal film having the catalytic activity is not formed on the non-plateable material portion 31 of the substrate W, the plating metal is not substantially precipitated and no hard mask layer 35 is formed thereat.

The hard mask layer 35 contains, as a main component, Co or a Co alloy containing B or P, or a Ni-based material. The Co or the Co alloy containing B or P may be, by way of non-limiting example, CoB, CoP, CoWP, CoWB, CoWBP, or the like. Further, the Ni-based material may be, by way of example, but not limitation, NiWB, NiB, NiWP, NiWBP, or the like.

After the plating processing as described above is completed, the substrate W held by the substrate holding unit 52 is cleaned. At this time, while controlling the driving unit 524 to rotate the substrate W held by the substrate holding unit 52 at a preset speed, the controller 3 controls the cleaning liquid supply unit 55b to locate the nozzle 551b at the position above the substrate W and to supply the cleaning liquid N2 onto the substrate W from the nozzle 551b. The cleaning liquid N2 supplied onto the substrate W is diffused on the surface of the substrate W by a centrifugal force which is caused by the rotation of the substrate W. Accordingly, the abnormal plating film or the reaction by-product adhering to the substrate W is removed from the substrate W. The cleaning liquid N2 scattered from the substrate W is drained through the cup 57.

Then, while controlling the driving unit 524 to rotate the substrate W held by the substrate holding unit 52 at a preset speed, the controller 3 controls the rinse liquid supply unit 55c to locate the nozzle 551c at the position above the substrate W and to supply the rinse liquid N3 onto the substrate W from the nozzle 551c. Accordingly, the plating liquid M1, the cleaning liquid N2 and the rinse liquid N3 on the substrate W are scattered from the substrate W by a centrifugal force which is caused by the rotation of the substrate W, and are drained through the cup 57.

Thereafter, the substrate W on which the hard mask layer 35 is formed is carried out of the plating device 5. At this time, the controller 3 controls the transfer device 222 to take out the substrate W from the plating device 5 and place the taken-out substrate W in the delivery unit 214. Then, the controller 3 controls the transfer device 213 to take out the substrate W placed on the delivery unit 214 and to carry the substrate W into the carrier C in the placing section 211.

Figure 6A:
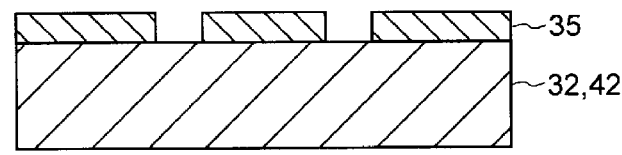
FIG. 6A to FIG. 6C are schematic cross sectional views illustrating a method of processing the substrate on which the hard mask layer is formed by the forming method of the hard mask according to the exemplary embodiment.

Then, the non-plateable material portion 31 is removed selectively from the substrate W which is taken out of the plating device 5 (FIG. 6A). Meanwhile, the hard mask layer 35 formed on the plateable material portion 32 remains without being removed. Accordingly, the substrate W having the base member 42 made of the plateable material portion 32 and the patterned hard mask layer 35 formed on the base member 42 is obtained. At a portion of the base member 42 which is not covered with the hard mask layer 35, the based member 42 (plateable material portion 32) is exposed.

Figure 6B:
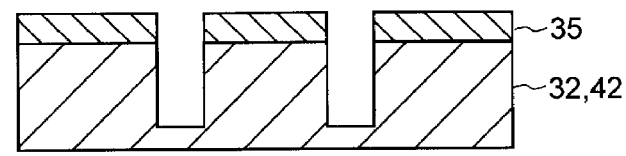

Subsequently, as shown in FIG. 6B, the base member 42 made of the plateable material portion 32 is dry-etched by using the hard mask layer 35 as a mask. Accordingly, the portion of the base member 42 which is not covered with the hard mask layer 35 is etched to a preset depth, and recess portions having the pattern shape are formed.

Figure 6C:
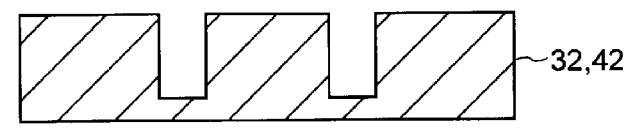

Afterwards, by removing the hard mask layer 35 by a wet cleaning method, the base member 42 provided with the recess portions having the pattern shape is obtained, as illustrated in FIG. 6C. Since the hard mask layer 35 can be removed by the wet cleaning method, it is easy to remove the hard mask layer 35. An acidic solvent is employed as a chemical liquid for this wet cleaning method.

As stated above, according to the present exemplary embodiment, by performing the catalyst imparting processing upon the substrate W, the catalyst is selectively imparted to the plateable material portion 32. Then, by performing the plating processing upon the substrate W, the hard mask layer 35 is formed selectively on the plateable material portion 32. Since a transcription process of the pattern to the hard mask is not required in this method, the process of forming the hard mask can be simplified and a problem that the pattern shape of the hard mask is deformed when forming the hard mask can be suppressed. Furthermore, there is no concern that the material of the hard mask is affected by a heat treatment which is performed when the pattern is formed on the resist layer.

In addition, according to the present exemplary embodiment, since the hard mask layer 35 is formed by plating, the hard mask layer 35 can be formed to be thick by increasing the thickness of the plating. Therefore, even if the hard mask layer 35 is also etched when the dry-etching is performed, the hard mask layer 35 can still remain when the dry-etching is ended.

Moreover, according to the present exemplary embodiment, since no resist is formed on the hard mask layer 35, it is not necessary to consider the adhesivity between the material of the hard mask layer 35 and the material of the resist, but it is only needed to consider the adhesivity between the material of the hard mask layer 35 and the material of the base member 42 (plateable material portion 32). Thus, a restriction in the material of the hard mask layer 35 is reduced, and the material can be selected from more various options.

Modification Example of Forming Method of Hard Mask

Now, a modification example of the forming method of the hard mask will be explained with reference to FIG. 7A to FIG. 7H. FIG. 7A to FIG. 7H are diagrams illustrating the forming method of the hard mask according to the present modification example. The modification example shown in FIG. 7A to FIG. 7H is different from the above-described exemplary embodiment in that the based member 42 is mainly made of the non-plateable material portion 31 and a core member 41 is made of the plateable material portion 32.

Figure 7A:
FIG. 7A to FIG. 7H are schematic cross sectional views illustrating a modification example of the exemplary embodiment.
Figure 7B:

As illustrated in FIG. 7A, the based member 42 formed of the non-plateable material portion 31 containing $SiO_2$ as the main component is first prepared. Then, as shown in FIG. 7B, by the CVD method or the PVD method, for example, an intermediate layer 43 constituting the plateable material portion 32 is formed on the entire surface of the base member 42 which is formed of the non-plateable material portion 31. Though a material of the intermediate layer 43 is not particularly limited, SiN which is generally used as the hard mask material may be utilized.

Figure 7C:
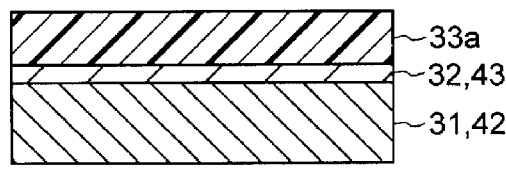
Figure 7D:
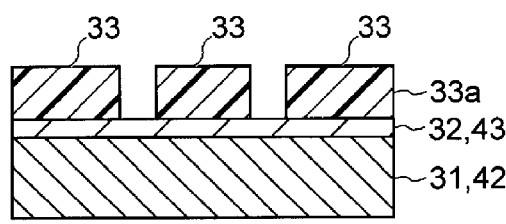

Thereafter, as depicted in FIG. 7C, the photosensitive resist 33a is coated on the entire surface of the intermediate layer 43 and is then dried. Afterwards, as shown in FIG. 7D, the photosensitive resist 33a is exposed to light through a photo mask and is then developed, so that the resist film 33 having a required pattern is formed.

Figure 7E:
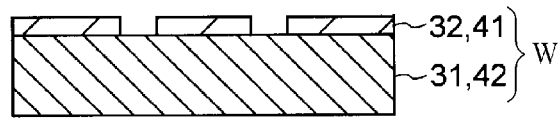

Subsequently, as illustrated in FIG. 7E, the dry-etching is performed on the intermediate layer 43 via the resist film 33, so that the plateable material portion 32 is formed to have the required pattern. Thereafter, by removing the resist film 33, there is obtained a substrate W having the base member 42 formed of the non-plateable material portion 31 and the core member 41 formed of the plateable material portion 32.

Figure 7F:
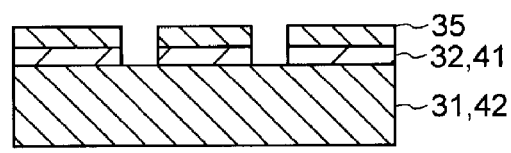

Then, by performing the catalyst imparting processing on the plateable material portion 32 of the substrate W, the catalysis is imparted selectively to the plateable material portion 32. Thereafter, as shown in FIG. 7F, by performing the plating processing on the substrate W, the hard mask layer 35 is selectively formed on the plateable material portion 32.

Figure 7G:
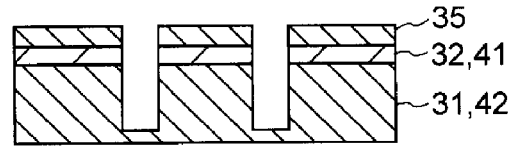

Afterwards, as depicted in FIG. 7G, the base member 42 made of the non-plateable material portion 31 is dry-etched by using the hard mask layer 35 as a mask. As a result, recess portions having the pattern shape is formed at the portion of the based member 42 which is not covered with the hard mask layer 35.

Figure 7H:
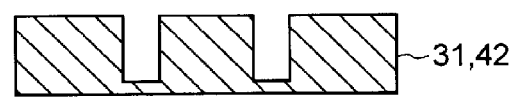

Thereafter, as shown in FIG. 7H, by removing the hard mask layer 35 through the wet-cleaning and the plateable material portion 32 by using, for example, the acidic solvent, the base member 42 provided with the recess portions having the pattern shape is obtained.

In the present modification example as well, the transcription process of the pattern to the hard mask is unnecessary. Thus, the process of forming the hard mask can be simplified, and there is no concern that the hard mask material is affected by the heat treatment which is performed when the pattern is formed on the resist layer.

Modification Example of Manufacturing Method of Substrate

Now, referring to FIG. 8A to FIG. 8H, a modification example of a manufacturing method of a substrate on which a hard mask layer is to be formed will be explained. FIG. 8A to FIG. 8H are diagrams illustrating the modification example of the manufacturing method of the substrate W shown in FIG. 3.

Figure 8A:
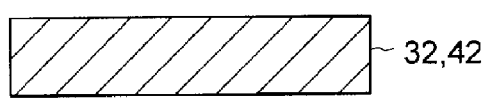
FIG. 8A to FIG. 8H are schematic cross sectional views illustrating a modification example of the manufacturing method of the substrate on which the hard mask layer is formed.

First, as shown in FIG. 8A, the base member 42 made of the plateable material portion 32 is prepared. As stated above, the base member 42 is made of the material including, as the main component, the material containing at least one of the $OCH_x$ group and the $NH_x$ group, the metal material containing the Si-based material as the main component, the catalyst metal material, or the material containing the carbon as the main component.

Figure 8B:

Then, as shown in FIG. 8B, by employing the CVD method or the PVD method, for example, a film of a material layer 46a for a sacrificial hard mask, which forms the sacrificial hard mask, is formed on the entire surface of the base member 42 made of the plateable material portion 32. The material layer 46a for the sacrificial hard mask may be made of, for example, the material containing carbon as the main component, more specifically, amorphous carbon. Alternatively, the material layer 46a for the sacrificial hard mask may be made of titanium nitride, tungsten, or the like. Further, the material layer 46a for the sacrificial hard mask is not limited to a single layer but may be multilayered. By way of non-limiting example, the material layer 46a for the sacrificial hard mask may include a SiN (silicon nitride) layer on the base member 42 and an amorphous carbon layer on the SiN layer.

Figure 8C:
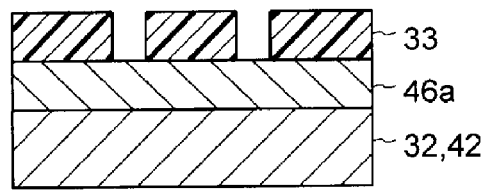

Subsequently, as illustrated in FIG. 8C, the resist film 33 having the required pattern is formed on the material layer 46a for the sacrificial hard mask.

Figure 8D:
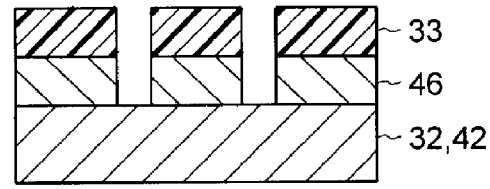
Figure 8E:
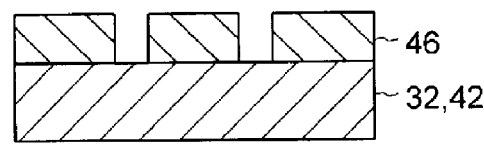

Then, as depicted in FIG. 8D, the material layer 46a for the sacrificial hard mask is dry-etched by using the resist film 33 as a mask. As a result, a sacrificial hard mask layer 46 having the substantially same pattern shape as the resist film 33 is obtained. Thereafter, the resist film 33 is removed, as shown in FIG. 8E.

Figure 8F:
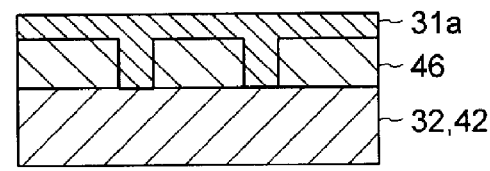

Afterwards, as depicted in FIG. 8F, a film of a material 31a, which forms the non-plateable material portion 31, is formed to cover the sacrificial hard mask layer 46 and the base member 42 exposed through opening portions of the sacrificial hard mask layer 46. The film of the material 31a is formed on the entire surfaces of the sacrificial hard mask layer 46 and the base member 42 by, for example, the CVD method or the PVD method. The material 31a is made of a material containing $SiO_2$ as the main component, as stated above.

Figure 8G:
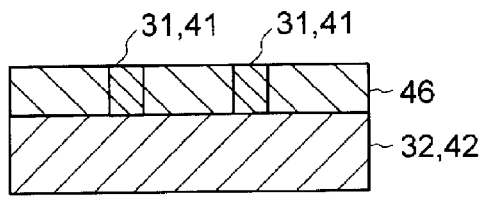

Thereafter, as illustrated in FIG. 8G, the material 31a is removed in a thickness direction thereof until the surface of the sacrificial hard mask layer 46 is exposed. As a result, the core member 41 made of the non-plateable material portion 31 having the required thickness is formed on the base member 42 which is made of the plateable material portion 32. A pattern of the core member 41 is formed to have the substantially same shape as the shape of the opening portions of the resist film 33.

Figure 8H:
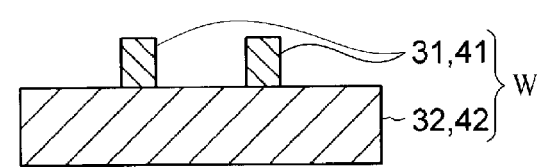

Then, as shown in FIG. 8H, the sacrificial hard mask layer 46 is completely removed by using, for example, a plasma etching method, so that the substrate W, shown in FIG. 3, having the non-plateable material portion 31 and the plateable material portion 32 on the surface thereof is obtained.

According to the present modification example, since the pattern of the core member 41 made of the non-plateable material portion 31 is formed by using the sacrificial hard mask layer 46 having high etching resistance, the pattern of the core member 41 can be further miniaturized.

Another Modification Example of Manufacturing Method of Substrate

Now, referring to FIG. 9A to FIG. 9H, another modification example of the manufacturing method of the substrate on which the hard mask layer is to be formed will be explained. FIG. 9A to FIG. 9H are diagrams illustrating another modification example of the manufacturing method of the substrate W on which the non-plateable material portion 31 and the plateable material portion 32 are formed.

Figure 9A:
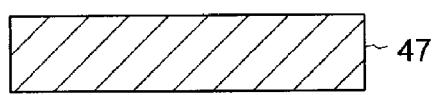
FIG. 9A to FIG. 9H are schematic cross sectional views illustrating another modification example of the manufacturing method of the substrate on which the hard mask layer is formed.

First, as shown in FIG. 9A, a substrate main body 47 is prepared. A material of the substrate main body 47 is not particularly limited. By way of example, like the non-plateable material portion 31, the material of the substrate main body 47 may be a material containing $SiO_2$ as a main component. Alternatively, like the plateable material portion 32, for example, the substrate main body 47 may be made of the material including, as the main component, the material containing at least one of the $OCH_x$ group and the $NH_x$ group, the metal material containing the Si-based material as the main component, the catalyst metal material, or the material containing the carbon as the main component.

Figure 9B:
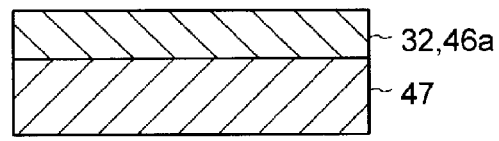

Then, as depicted in FIG. 9B, by employing the CVD method or the PVD method, for example, the material layer 46a for the sacrificial hard mask, which forms the sacrificial hard mask, is formed on the entire surface of the substrate main body 47. The material layer 46a for the sacrificial hard mask may be made of, for example, the plateable material portion 32. In this case, the material layer 46a for the sacrificial hard mask, which is formed of the plateable material portion 32, may be made of the material containing the carbon as the main component, for example, amorphous carbon. Further, the material layer 46a for the sacrificial hard mask is not limited to a single layer but may be multilayered. By way of non-limiting example, the material layer 46a for the sacrificial hard mask may include a SiN (silicon nitride) layer on the substrate main body 47 and an amorphous carbon layer on the SiN layer.

Figure 9C:
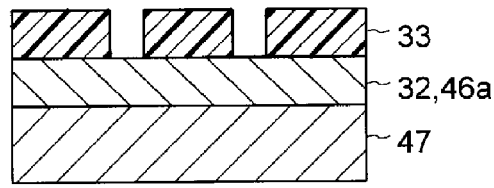

Subsequently, as illustrated in FIG. 9C, the resist film 33 having the required pattern is formed on the material layer 46a for the sacrificial hard mask which is formed of the plateable material portion 32.

Figure 9D:
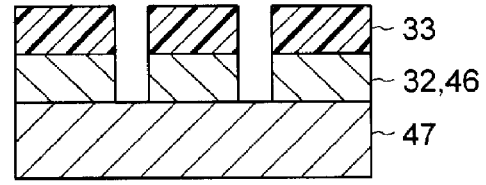
Figure 9E:
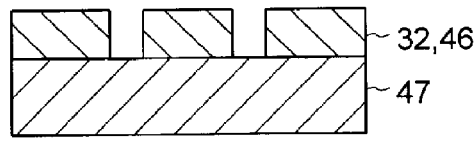

Then, as depicted in FIG. 9D, the material layer 46a for the sacrificial hard mask is dry-etched by using the resist film 33 as a mask. As a result, the sacrificial hard mask layer 46 having the substantially same pattern shape as the resist film 33 is obtained. Thereafter, the resist film 33 is removed, as shown in FIG. 9E.

Figure 9F:
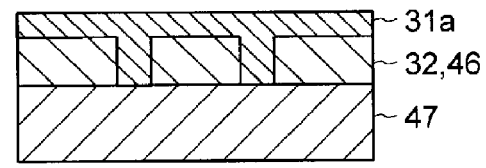

Afterwards, as depicted in FIG. 9F, the film of the material 31a, which forms the non-plateable material portion 31, is formed to cover the sacrificial hard mask layer 46 and the substrate main body 47 exposed through opening portions of the sacrificial hard mask layer 46. The film of the material 31a is formed on the entire surfaces of the sacrificial hard mask layer 46 and the substrate main body 47 by, for example, the CVD method or the PVD method. The material 31a is made of the material containing $SiO_2$ as the main component, as stated above.

Figure 9G:
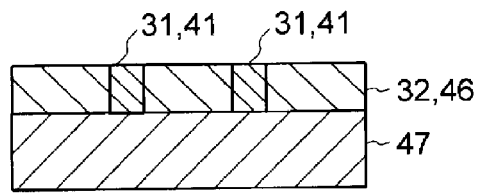

Thereafter, as illustrated in FIG. 9G, the material 31a is removed in the thickness direction thereof until the surface of the sacrificial hard mask layer 46 is exposed. As a result, the core member 41 made of the non-plateable material portion 31 having a required thickness is formed on the substrate main body 47. A pattern of the core member 41 is formed to have the substantially same shape as the shape of the opening portions of the resist film 33.

Figure 9H:
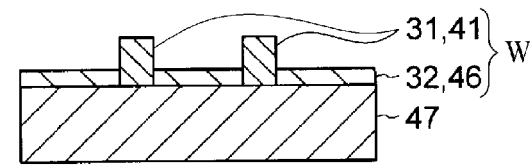

Then, as shown in FIG. 9H, only a part of the sacrificial hard mask layer 46 is etched in a thickness direction thereof by, for example, plasma etching method. At this time, the sacrificial hard mask layer 46 made of the plateable material portion 32 is partially left on the substrate main body 47. Accordingly, the substrate W having the non-plateable material portion 31 and the plateable material portion 32 on the surface of the substrate main body 47 is obtained.

According to the present modification example, by using the sacrificial hard mask layer 46 formed of the plateable material portion 32 having high etching resistance, the pattern of the core member 41 can be further miniaturized.

The above-described exemplary embodiments are not limiting, and various changes and modifications may be made to the constituent components without departing from the scope of the present disclosure. Further, various inventions may be conceived by combining multiple constituent components appropriately. Some of the constituent components disclosed in the present exemplary embodiments can be omitted, and constituent components from the different exemplary embodiments may be appropriately combined.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A forming method of a hard mask, comprising:
   preparing a substrate having a member made of a non-plateable material and a member made of a plateable material, the member made of the non-plateable material and the member made of the plateable material being exposed, and the member made of the plateable material protruding from the member made of the non-plateable material and having a predetermined pattern on the member made of the non-plateable material;
   supplying a catalyst selectively to an exposed surface of the member made of the plateable material by performing a catalyst supplying processing on the substrate;
   forming a hard mask layer selectively on the exposed surface of the member made of the plateable material by performing a plating processing on the substrate; and
   etching the member made of the non-plateable material by using the hard mask layer as a mask,
   wherein the non-plateable material comprises $SiO_2$ as a main component, and
   the plateable material comprises a material including, as a main component, a material containing at least one of a $OCH_x$ group and a $NH_x$ group or a material containing carbon as a main component.

2. The forming method of the hard mask of claim 1, wherein the plateable material includes, as the main component, a material containing a Si—$OCH_x$ group or a Si—$NH_x$ group.

3. The forming method of the hard mask of claim 1, wherein the hard mask layer is made of a material including, as a main component, Co or a Co alloy containing B or P, or a Ni-based material.

4. The forming method of the hard mask of claim 1, wherein the catalyst contains an iron group element, a platinum metal element, Cu, Ag or Au.

* * * * *